United States Patent
Dahlin

(10) Patent No.: US 7,230,490 B2
(45) Date of Patent: Jun. 12, 2007

(54) VOLTAGE TO CURRENT CONVERTER AND METHOD FOR CONVERTING

(75) Inventor: Jan Dahlin, Jäfrälla (SE)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 10/984,324

(22) Filed: Nov. 9, 2004

(65) Prior Publication Data

US 2005/0099211 A1  May 12, 2005

(30) Foreign Application Priority Data

Nov. 10, 2003  (SE) .................................. 0302958-4

(51) Int. Cl.
    *H03G 3/12* (2006.01)
(52) U.S. Cl. ...................................................... 330/283
(58) Field of Classification Search ................. 330/283
    See application file for complete search history.

(56) References Cited

U.S. PATENT DOCUMENTS

| | | | |
|---|---|---|---|
| 3,364,434 A | 1/1968 | Widlar | 330/22 |
| 4,423,391 A * | 12/1983 | Ebenhoeh | 333/28 R |
| 4,514,702 A | 4/1985 | Zogg | 330/254 |
| 5,057,787 A | 10/1991 | Arai et al. | 330/254 |
| 5,493,255 A * | 2/1996 | Murtojarvi | 330/296 |
| 2003/0062951 A1 | 4/2003 | Twomey | 330/254 |

FOREIGN PATENT DOCUMENTS

| | | |
|---|---|---|
| EP | 1 357 664 A2 | 10/2003 |
| GB | 1288880 | 8/1970 |
| GB | 2334 163 | 8/1999 |

OTHER PUBLICATIONS

European Search Report for application No. EP 04445114.4, 2 pages.
European Office Action for application No. EP04445114.4, 4 pages.
Wada K. et al: "Wide-Input Range Linear Voltage-to-Current Converter Using Equivalent Mosfets Without Cutoff Region" Ieice Transactions On Fundamentals of Electronics, Communications and Computer Sciences, Institute of Electronics Information and Comm. Eng. Tokyo, JP vol. E85-A, No. 2, Feb. 2002 (2002-02), pp.347-353.

* cited by examiner

*Primary Examiner*—Robert Pascal
*Assistant Examiner*—Alan Wong
(74) *Attorney, Agent, or Firm*—Baker Botts L.L.P.

(57) ABSTRACT

A voltage to current converter comprises a signal stage (1) with a first transistor (11) and a first resistor (12). The first transistor (11) is adapted to be fed with an input signal voltage ($V_{in}$). The converter is adapted to generate an output current, comprising an output DC bias current ($I_{B1}$) and an output signal current ($i_{out}$), and to provide a gain adjustment through the variation of the first resistor (12). The converter further comprises a bias stage (2), adapted to generate and feed the signal stage (1) with an input DC bias voltage ($V_{DC}$), which input DC bias voltage ($V_{DC}$) is adapted to keep the output DC bias current ($I_{B1}$) constant during the variation of the first resistor (12).

14 Claims, 1 Drawing Sheet

VOLTAGE TO CURRENT CONVERTER AND METHOD FOR CONVERTING

PRIORITY

This application claims priority to Swedish application no. 0302958-4 filed Nov. 10, 2003.

TECHNICAL FIELD OF THE INVENTION

The present invention relates to a voltage to current converter, comprising a signal stage with a first transistor and a first resistor. The first transistor is adapted to be fed with an input signal voltage. The converter is adapted to generate an output current, comprising an output DC bias current and an output signal current, and to provide a gain adjustment through the variation of the first resistor.

The present invention also relates to a method for converting a voltage to a current.

DESCRIPTION OF THE BACKGROUND ART

It is known to add different kinds of variable gain amplifiers (VGA) in front of the voltage to current converter.

Patent publication GB 2 334 163 shows a variable transconductance amplifier comprising two transistors whose emitters are connected via resistors to a constant current source to form a differential or long tail pair. A feedback amplifier whose transconductance is controllable has inputs connected to the collectors of the transistors and outputs connected to the emitters thereof. The feedback amplifier thus supplies a differential current to the emitters of the transistors, which corresponds to the product of the differential output signal of the transistors and the variable transconductance of the feedback amplifier. The arrangement is said to improve the noise figure.

Patent publication US 2003/0062951 shows a mixer/amplifier capable of providing variable gain while maintaining a substantially constant common mode operating voltage level and maintaining a substantially constant operating voltage in new, low voltage designs, thus providing a mixer/amplifier in low-power direct conversion receiver.

A low noise amplifier is shown in which a gain control signal is provided through a differential current source. Two output currents I1 and I2 are provided. I1+I2=a constant. I1 and I2 are mirrored in first and second paths, one including amplifier transistors and optionally a Gilbert cell multiplier. Irrespective of amplifier gain, the current through the two paths remains equal to I1 and I2, and common mode voltage remains constant.

SUMMARY OF THE PRESENT INVENTION

It is a problem to present a voltage to current converter with gain adjustment without varying the performance parameters such as current consumption and output linearity as the gain is adjusted.

It is specifically a problem to do this without adding extra components in the signal path, which in turn means extra errors added, such as noise and non-linearity, or extra power consumption.

With the purpose of solving one or more of the above-identified problems, and from the standpoint of a voltage to current converter, comprising a signal stage with a first transistor and a first resistor, the first transistor being adapted to be fed with an input signal voltage, the converter being adapted to generate an output current, comprising an output DC bias current and an output signal current, and to provide a gain adjustment through the variation of the first resistor, the present invention teaches that the converter comprises a bias stage, adapted to generate and feed the signal stage with an input DC bias voltage, where the input DC bias voltage is adapted to keep the output DC bias current constant during the variation of the first resistor, thus providing a gain adjustment without any variation of performance parameters such as current consumption and output linearity.

In order to generate this input DC bias voltage, the present invention teaches that the bias stage comprises a second transistor and a second adjustable resistor, essentially forming a copy of the signal stage. The second transistor is diode connected, thus essentially forming a current mirror in conjunction with the first transistor. The bias stage is adapted to be fed by a constant input DC bias current, and the second resistor is adapted to be varied simultaneously with the variation of the first resistor.

With the purpose of minimizing the power consumption of the bias stage, the present invention teaches that the second transistor is adapted to have a transistor area that is a factor M smaller than the transistor area of the first transistor, that the second resistor is adapted to have a resistance that is the same factor M larger than the resistance of the first resistor, whereby the input DC bias current is adapted to be reduced with the factor M in relation to the output DC bias current.

In order to simplify the control of the bias stage, the present invention teaches that the first and second resistor are adapted to be mutually varied and controlled by the same control signal.

The present invention teaches that it is possible that the bias stage is integrated with the signal stage, the converter being integrated within the same integrated circuit, thus arriving at a solution according to the present invention without adding any extra components.

The present invention also relates to a method for converting a voltage to a current, which will be described in more detail in the following description of presently preferred embodiments.

The advantages of a converter according to the present invention is that the inventive converter presents a variable gain while maintaining a constant bias current across the whole gain setting range. An inventive converter provides a control of current consumption, independent of gain setting. It also provides a possibility to dimension the load independently of the gain setting, thus providing a performance optimised for a certain current density that is valid across the whole gain setting range.

The inventive converter can be manufactured within the same integrated circuit and thus provide the above advantages within the functions of one component, and with greatly diminished extra errors, such as noise, non-linearity etc.

BRIEF DESCRIPTION OF THE DRAWINGS

A converter and a method according to the present invention will now be described in detail with reference to the accompanying drawings, in which.

DESCRIPTION OF THE PREFERRED EMBODIMENTS

Figure 1:
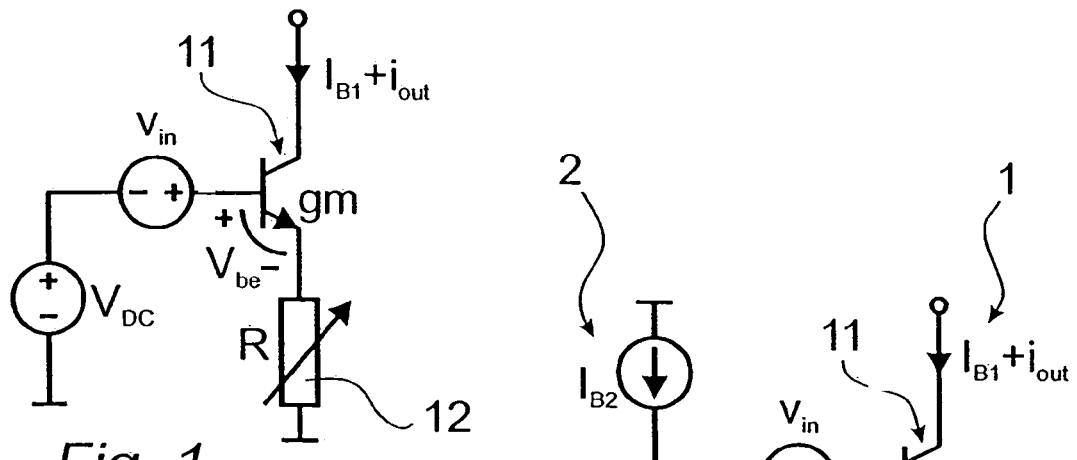
FIG. 1 is a schematic and simplified illustration of a known voltage to current converter.

With reference to FIG. 1, a voltage to current converter according to prior art is described. The known converter comprises a first transistor 11 and a first resistor 12, where the first transistor 11 is adapted to be fed with an input DC bias voltage $V_{DC}$ and an input signal voltage $v_{in}$, and where the converter is adapted to generate an output current, comprising an output DC bias current $I_{B1}$ and an output signal current $i_{out}$.

The converter is adapted to provide a gain adjustment through the variation of the first resistor 12.

The voltage to current transfer function can be expressed as:

$$\frac{i_{out}}{v_{in}} = \frac{gm}{1+gm \cdot R}$$

Where gm is the transconductance of the first transistor 11 and R is the resistance of the first resistor 12. Providing the transconductance gm of the first transistor 11 is large (gm>>1/R) the voltage to current transfer function can be expressed as:

$$\frac{i_{out}}{v_{in}} = \frac{1}{R}$$

A straightforward way to implement adjustable gain is to make the resistance R adjustable, as shown in the figure. However, the output DC bias current $I_{B1}$ is determined by:

$$I_{B1} = \frac{V_{DC} - V_{be}}{R}$$

where $V_{be}$ is the base-emitter voltage of the first transistor 11.

Hence, by varying the resistance R, the output DC bias current $I_{B1}$ will also vary, which will cause the operating point of the first transistor 11 to vary. The purpose of the invention is to maintain an optimal operating point, and thus maintain the output linearity, of the first transistor 11 regardless of the variation of the resistance R.

Figure 2:
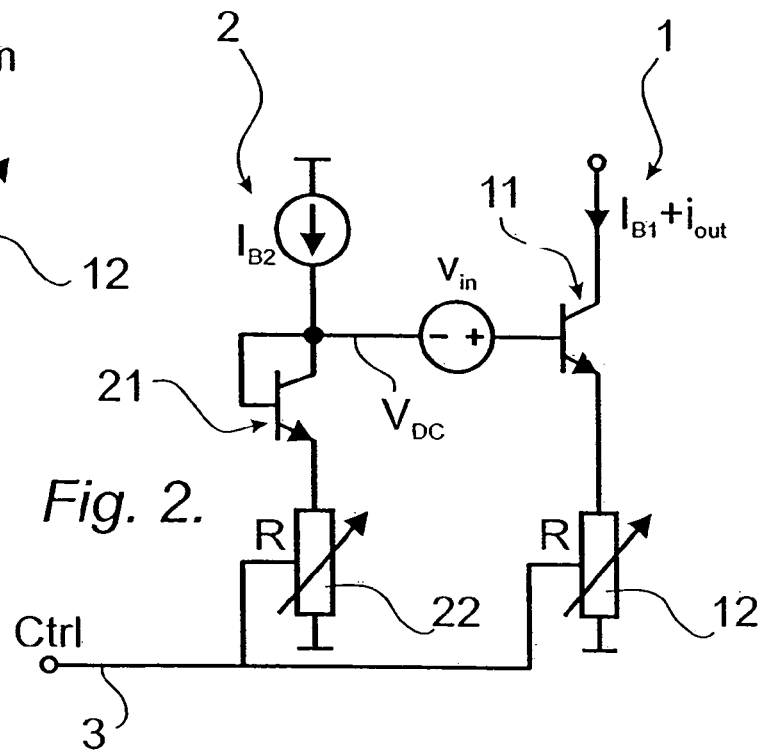
FIG. 2 is a schematic and simplified illustration of a voltage to current converter according to the present invention.

A voltage to current converter according to the present invention will now be described with reference to FIG. 2.

The inventive converter comprises a signal stage 1 according to FIG. 1, but it also comprises a bias stage 2, adapted to generate and feed the signal stage 1 with an input DC bias voltage $V_{DC}$, which input DC bias voltage is adapted to keep the output DC bias current $I_{B1}$ constant during the variation of the first resistor 12.

The bias stage 2 comprises a second transistor 21 and a second adjustable resistor 22 essentially forming a copy of the signal stage 1. The figure shows that the second transistor 21 is diode connected, thus essentially forming a current mirror in conjunction with the first transistor 11. The bias stage 2 is adapted to be fed by a constant input DC bias current $I_{B2}$.

The present invention specifically teaches that the second resistor 22 is adapted to be varied simultaneously with the variation of the first resistor 12.

Figure 3:
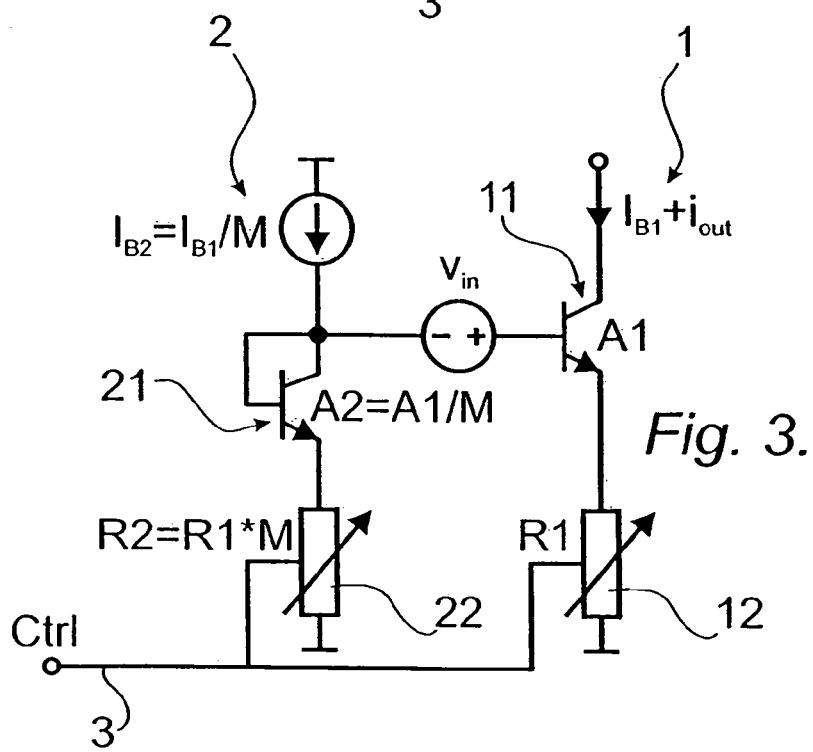
FIG. 3 is a schematic and simplified illustration of an inventive voltage to current converter adapted to a reduced input DC bias current.

FIG. 3 shows that with the purpose of reducing the input DC bias current $I_{B2}$ in relation to the output DC bias current $I_{B1}$, the present invention teaches that the input DC bias current $I_{B2}$ can be reduced with a factor M in relation to the output DC bias current $I_{B1}$ by adapting the second transistor 21 to have a transistor area A2 that is a factor M smaller than the transistor area A1 of the first transistor 11, and by adapting the second resistor 22 to have a resistance R2 that is said factor M larger than the resistance R1 of the first resistor 12.

The present invention also teaches that the first and second resistors 12, 22 are adapted to be mutually varied and controlled by the same control signal 3, thus allowing a simple control of the inventive converter.

One proposed embodiment of the present invention teaches that the bias stage 2 is integrated with the signal stage 1, the converter thus being integrated within the same integrated circuit.

The present invention also relates to a method for converting a voltage to a current through a voltage to current converter.

This method will be described with a renewed reference to FIG. 2, where it is shown that the converter comprises a signal stage 1, with a first transistor 11, and a first resistor 12, where the first transistor 11 is fed with an input signal voltage $v_{in}$, where the converter generates an output current, comprising an output DC bias current $I_{B1}$ and an output signal current $i_{out}$, and where the converter provides a gain adjustment through the variation of the first resistor 12.

The inventive method teaches the use of a bias stage 2 that generates and feeds the signal stage 1 with an input bias voltage $V_{DC}$, where the input bias voltage $V_{DC}$ keeps the output DC bias current $I_{B1}$ constant during the variation of the first resistor 12.

The inventive method teaches the use of a bias stage 2 comprising a second transistor 21 and a second adjustable resistor 22, essentially forming a copy of the signal stage 1, where the second transistor 21 is diode connected, thus in conjunction with the first transistor 11 essentially forming a current mirror to the signal stage 1.

The bias stage 2 is fed by a constant input DC bias current $I_{B2}$, and the second resistor 22 is varied simultaneously with the variation of the first resistor 12, resulting in the constant output DC bias current $I_{B1}$.

The input DC bias current $I_{B2}$ is reduced to be a factor M smaller than the output DC bias current $I_{B1}$ by selecting the transistor area A2 of the second transistor 21 to be the factor M smaller than the transistor area A1 of the first transistor 11, and by selecting the resistance R2 of the second resistor 22 to be the factor M larger than the resistance R1 of the first resistor 12.

The inventive method teaches that the first and second resistors 12, 22 are mutually controlled by the same control signal 3.

In the description above, and in the following claims, bipolar NPN transistors have been used to describe the practical implementation of the present invention. In order to simplify the description the invention has not been described using other kinds of transistors. It is however obvious to the skilled person that any other type of transistor, like bipolar PNP transistors or MOS transistors of N or P type may be used to achieve the same results and that any such embodiment of the present invention is equivalent to the embodiments described above and in the following claims.

It will be understood that the invention is not restricted to the aforedescribed and illustrated exemplifying embodiments thereof and that modifications can be made within the scope of the inventive concept as illustrated in the accompanying claims.

I claim:

1. A voltage to current converter, comprising:
   a signal stage with a first transistor adapted to be fed with an input signal voltage, and a first resistor, and
   a bias stage, adapted to generate and feed said signal stage with an input DC bias voltage,
   wherein said converter is adapted to generate an output current comprising an output DC bias current and an output signal current, and to provide a gain adjustment through the variation of said first resistor,
   wherein said input DC bias voltage being adapted to keep said output DC bias current constant during said variation of said first resistor, and
   wherein said bias stage comprises a second transistor and a second adjustable resistor, wherein said bias stage is adapted to be fed by a constant input DC bias current, and wherein said second resistor is adapted to be varied simultaneously with the variation of said first resistor.

2. The converter according to claim 1, wherein the bias stage forms a copy of said signal stage, wherein said second transistor is diode connected, thus essentially forming a current mirror in conjunction with said first transistor.

3. The converter according to claim 2, wherein said second transistor is adapted to have a transistor area that is a factor M smaller than the transistor area of said first transistor, wherein said second resistor is adapted to have a resistance that is said factor M larger than the resistance of said first resistor, and wherein said input DC bias current thus is adapted to be reduced with said factor M in relation to said output DC bias current.

4. The converter according to claim 2, wherein said first and second resistor are adapted to be mutually varied and controlled by a control signal.

5. The converter according to claim 1, wherein said bias stage is integrated with said signal stage, said converter thus being integrated within the same integrated circuit.

6. A method for converting a voltage to a current through a voltage to current converter, said converter comprising a signal stage, with a first transistor and a first resistor, and a bias stage comprising a second transistor and second adjustable resistor, the method comprising the steps of:
   feeding said first transistor with an input signal voltage, wherein said converter generates an output current, comprising an output DC bias current and an output signal current,
   providing a gain adjustment through the variation of said first resistor,
   generating and feeding said signal stage with an input DC bias voltage by said bias stage, wherein said input DC bias voltage keeps said output DC bias current constant during said variation of said first resistor, by feeding said bias stage by a constant input DC bias current, and varying said second resistor simultaneously with the variation of said first resistor, resulting in said constant output DC bias current.

7. The method according to claim 6, wherein said bias stage forms a copy of said signal stage, wherein said second transistor is diode connected, thus essentially forming a simple current mirror in conjunction with said first transistor.

8. The method according to claim 7, further comprising the step of reducing said input DC bias current to be a factor M smaller than said output DC bias current by selecting the transistor area of said second transistor to be said factor M smaller than the transistor area of said first transistor, and by selecting the resistance of said second resistor to be said factor M larger than the resistance of said first resistor.

9. The method according to claim 7, comprising the step of controlling said first and second resistor mutually by a control signal.

10. A voltage to current converter, comprising:
    a signal stage with a first transistor adapted to be fed with an input signal voltage, and a first controllable variable resistor, generating an output current comprising an output DC bias current and an output signal current, and providing a gain adjustment through the variation of said first controllable variable resistor,
    a bias stage, adapted to generate and feed said signal stage with an input DC bias voltage, wherein said input DC bias voltage being adapted to keep said output DC bias current constant during said variation of said first controllable variable resistor and wherein said bias stage comprises a second transistor and a second adjustable resistor, wherein said bias stage is adapted to be feed by a constant input DC bias current, and wherein said second resistor is adapted to be varied simultaneously with the variation of said first resistor.

11. The converter according to claim 10, wherein bias stage forms a copy of said signal stage, wherein said second transistor is diode connected, thus essentially forming a current mirror in conjunction with said first transistor.

12. The converter according to claim 11, wherein said second transistor is adapted to have a transistor area that is a factor M smaller than the transistor area of said first transistor, wherein said second controllable variable resistor is adapted to have a resistance that is said factor M larger than the resistance of said first controllable variable resistor, and wherein said input DC bias current thus is adapted to be reduced with said factor M in relation to said output DC bias current.

13. The converter according to claim 11, wherein said first and second controllable variable resistor are mutually varied and controlled by a control signal.

14. The converter according to claim 10, wherein said bias stage is integrated with said signal stage, said converter thus being integrated within the same integrated circuit.

* * * * *